United States Patent [19]

Mitarai

[11] 4,031,473

[45] June 21, 1977

[54] STATION SELECTING DEVICE HAVING IMPROVED MONITOR

[75] Inventor: Kaoru Mitarai, Tokyo, Japan

[73] Assignee: Trio Electronics Incorporated, Tokyo, Japan

[22] Filed: Nov. 14, 1974

[21] Appl. No.: 523,860

[30] Foreign Application Priority Data

Apr. 3, 1974  Japan .............................. 49-37642

[52] U.S. Cl. .............................................. 325/455
[51] Int. Cl.$^2$ .......................................... H04B 1/06
[58] Field of Search ............................. 325/18–21, 325/26, 31, 25, 455, 458, 459, 464, 335; 343/206

[56] References Cited

UNITED STATES PATENTS

| | | | |
|---|---|---|---|
| 3,345,569 | 10/1967 | Casterline et al. | 325/25 |
| 3,381,222 | 4/1968 | Gray | 325/25 |
| 3,426,279 | 2/1969 | Berman | 325/21 |
| 3,482,166 | 12/1969 | Gleason | 343/206 |
| 3,600,680 | 8/1971 | Maniere | 325/18 |
| 3,675,130 | 7/1972 | Bamberg | 325/25 |
| 3,835,384 | 9/1974 | Liff | 325/25 |
| 3,883,808 | 5/1975 | Boone et al. | 325/335 |

Primary Examiner—Richard Murray
Attorney, Agent, or Firm—Gerald J. Ferguson, Jr.; Joseph J. Baker

[57] ABSTRACT

A station selecting system for use in a multi-channel communication system having a plurality of display devices respectively corresponding to the communication channel. Circuitry is provided for placing the system in a monitor mode of operation where all channels are scanned once to determine which ones are available for communication, the latter channels being indicated by actuation of the display devices respectively corresponding thereto. Circuitry is also provided for placing the system in an autoscan mode of operation where the channels are sequentially scanned until a channel available for communication is located, at which time scanning ceases and the selected channel is indicated by the actuation of its corresponding display device.

5 Claims, 2 Drawing Figures

STATION SELECTING DEVICE HAVING IMPROVED MONITOR

CROSS REFERENCE TO RELATED APPLICATION

This application is related to a copending patent application entitled "Station Selecting Device Having Improved Noise Discrimination Circuitry" filed on instant date herewith by the inventors of the subject application and assigned to the assignee thereof, the foregoing application being incorporated herein by reference.

BACKGROUND OF THE INVENTION

This invention relates to a station selecting device having a monitor circuit to be used in a communication transmitting-and-receiving system or the like.

Recently, the number of stations for the communication transmitting-and-receiving systems and the like has increased significantly, particularly in the 2m band. Ordinarily, when a channel is transferred from a call channel to a subchannel or when it is transferred (in QSY) from a channel to another channel for QRM, the channel transfer is carried out by first finding a vacant channel by turning a channel selector, and consulting with the opposite station about the transfer of channel. However, it has frequently been the case that after a channel has been found which is vacant, the latter channel has been taken by another station before the actual transfer of channel takes place, and such intances will tend to increase in the future. On the other hand, in substantially less-crowded bands or in certain times of day such as midnight, it has been difficult to find another station to communicate with.

SUMMARY OF THE INVENTION

In view of the above described difficulties, it is a primary object of this invention to provide a station selecting device having an improved monitor circuit wherein all of the channels having sensing signals are displayed visually so that the status of all channels can be determined at one glance of the display.

This an other object of the invention will become apparent after a reading of the following specification and claims taken with the drawing.

DETAILED DESCRIPTION OF THE PREFERRED EMBODIMENT

Figure 1:
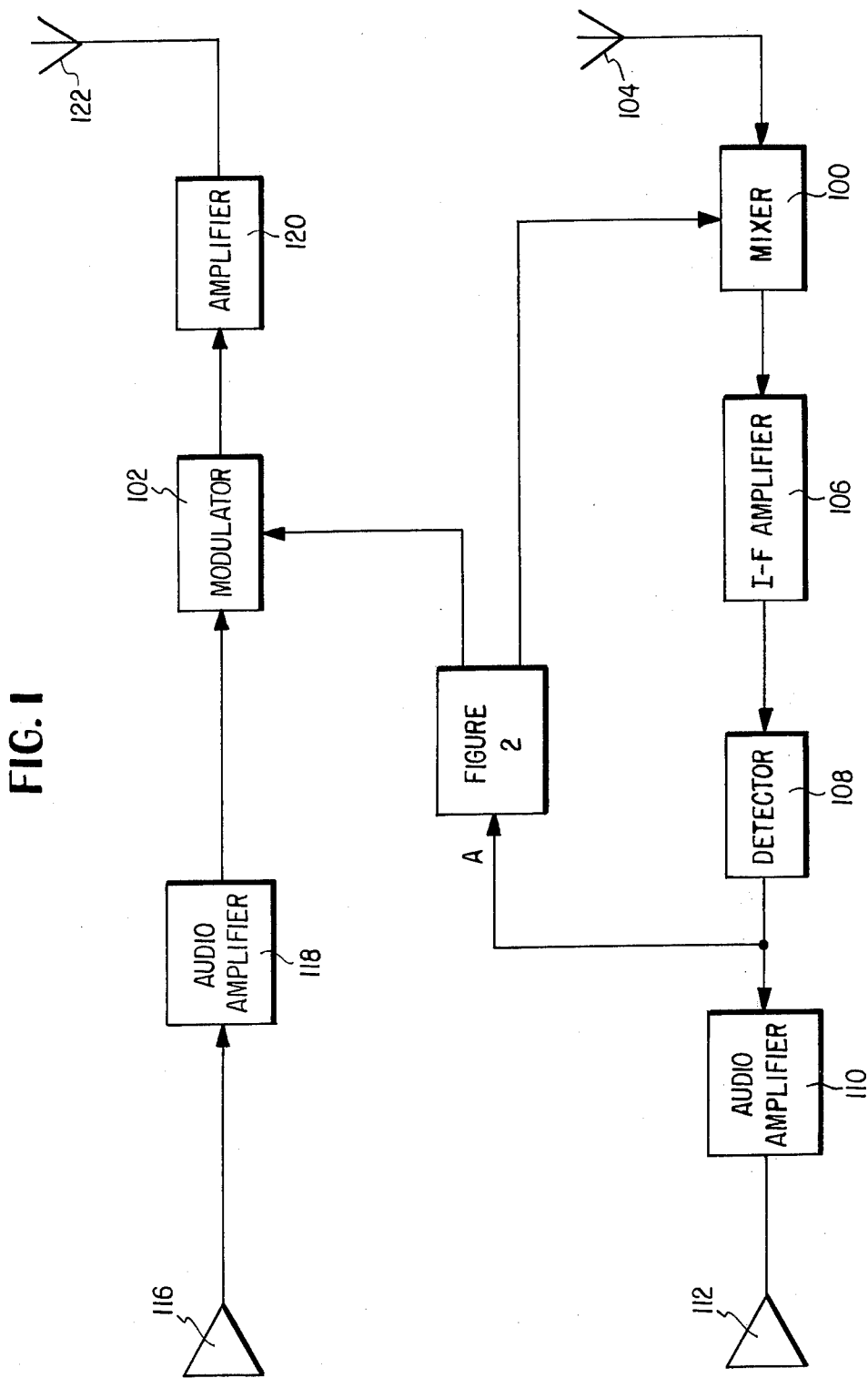
FIG. 1 is a block diagram of an illustrative embodiment of an overall system in which the station selection device with monitor of this invention may be employed.
Figure 2:
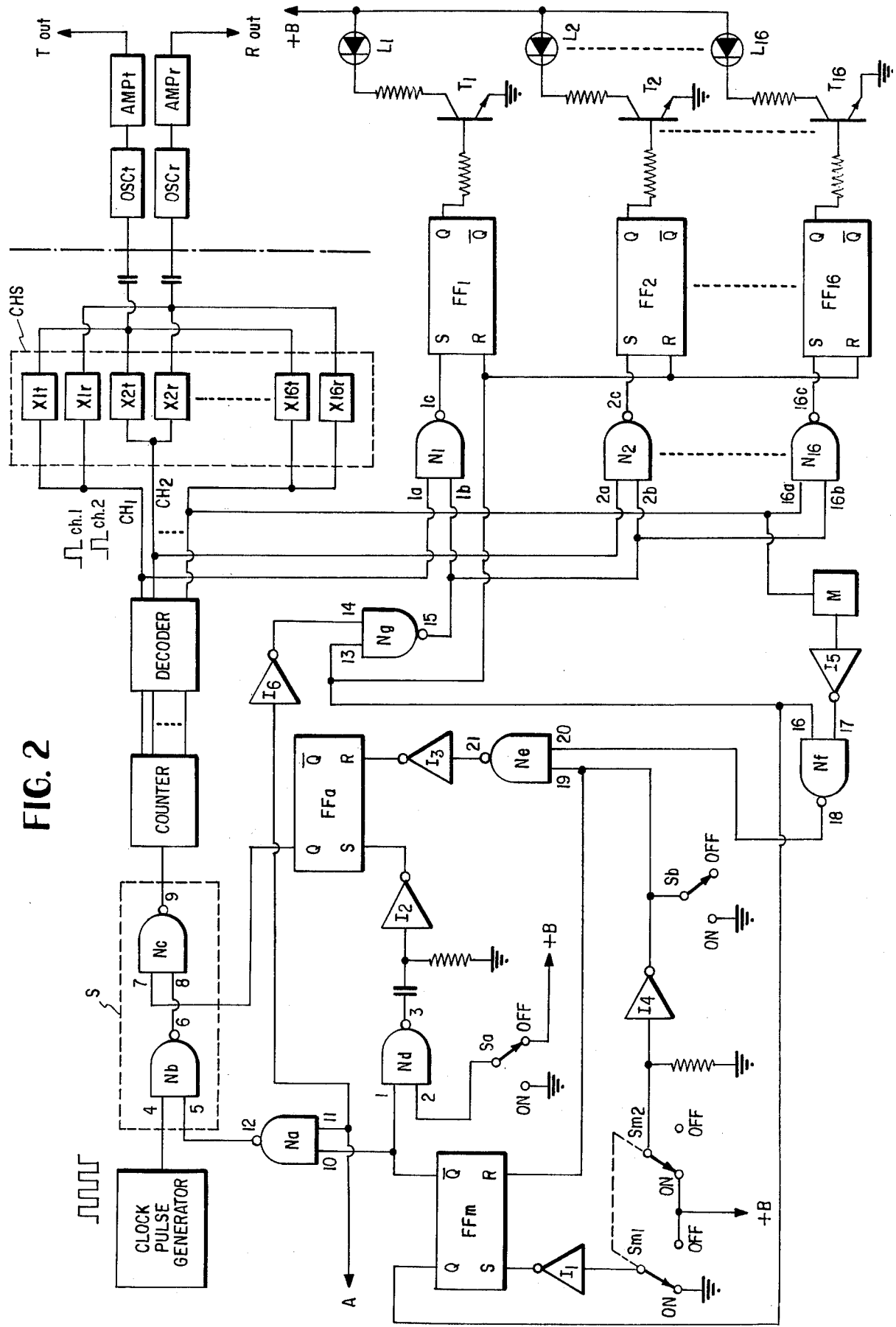
FIG. 2 is a combined schematic diagram and block diagram of an illustrative embodiment of the station selecting device with monitor of the present invention.

FIG. 1 is a block diagram of an illustrative overall system in which the station selecting and monitoring circuitry of the present invention is utilized. Thus, the block labelled FIG. 2 corresponds to FIG. 2. Referring to FIGS. 1 and 2, a channel switching device CHS is scanned by a decoder D, whereby the frequency of local oscillator signal applied to a input mixer 100 is varied as is the frequency of the carrier signal applied to a modulator 102 where the output from AMPr corresponds to the receiver local oscillator signal and the output from AMPt corresponds to the transmitter carrier signal. If channel 2, for example, is receiving a signal at an antenna 104, the received signal is eventually mixed with the local osicllator signal from AMPr corresponding to channel 2. At this time an I-F signal is generated which falls within the pass band of an I-F amplifier 106. The modulated I-F signal is detected by a detector 108, the detected, information signal then being amplified by an amplifier 110 and applied to a loud speaker 112, for example. The output from detector 108 is also applied to appropriate circuitry (not shown) and then to terminal A of FIG. 2. (Terminal A could also be responsive to the output of I-F amplifier 106.) This signal is then applied as a sensing signal A to NAND Na. During the autoscanning mode, to be described hereinafter, detection of signal A stops the scanning of the communication channels so that communication can take place in channel 2. The carrier signal for channel 2 is modulated by an audio signal, for example, applied to a microphone 116 and amplified by an amplifier 118. The modulated carrier wave is then amplified by an amplifier 120 and radiated from an antenna 122.

In the above embodiment, the system is so designed that the scanner stops when an active channel is located. The system could also be designed so that a sensing signal A is generated each time a vacant channel is located. This latter situation would occur whenever it is necessary to locate a vacant channel in which to communicate.

The invention will now be described with respect to an illustrative embodiment thereof, reference being made to FIG. 2 wherein, for the convenience of the description, the number of channels is selected to be sixteen. A clock pulse generator P comprising a non-stable multivibrator or the like generates clock pulses during monitor or autoscanning operations. A switching circuit S comprises NAND circuits Nb and Nc. A counter C counts the clock pulses from switching circuit S. A decoder D generates scanning pulses corresponding to the sixteen channels depending on the output from counter C. A channel switching circuit CHS includes transmitter oscillator elements $X_{1t}$ through $X_{16t}$ and receiver oscillator elements $X_{1r}$ through $X_{16r}$, each typically comprising a quartz oscillator element and respectively providing different frequency output signals for the transmission and reception of the communication channels $CH_1$ through $CH_{16}$ depending on the scanning pulses from decoder D. The signals from the transmitter oscillator elements $X_{1t}$ through $X_{16t}$ and receiver oscillator elements $X_{1r}$ through $X_{16r}$ are respectively applied to oscillator stages $OSC_t$ and $OSC_r$ and amplifiers $AMP_t$ and $AMP_r$ and thence to output terminals $T_{out}$ and $R_{out}$. Each oscillation stage $OSC_t$ or stage $OSC_r$ together with its associated oscillator elements generates an oscillation signal. They are then applied to mixing circuits.

A flip-flop circuit FFm controls the monitor operation and is operated by ON-OFF monitor switches Sm1 and Sm2, which are ganged together. Monitor switches Sm1 and Sm2 are so-called nonlock type switches which are, for instance, switched ON when pushed and switched OFF when released. An autoscanning flip-flop circuit FFa is operated either by ON-OFF operating an autoscanning switch Sa, which is also of the nonlock type, or by ON-OFF operating monitor switches Sm1 and Sm2. Flip-flop circuits FF1 - FF16 are respectively provided in the channel display circuits and hold the actuated displays during monitor operation. Transistors T1 - T16 switch display elements L1 - L16, which may be light emitting diodes (LED), for example. L1 – L16 are respectively connected to transistors T1 – T16. A NAND circuit Na has its inputs connected to the $\overline{Q}$ output of flip-flop FFm and the sensing signal A, which may be generated from a squelch circuit or the like. The output of NAND circuit Na is applied to switching circuit S. A NAND circuit Nd has an input connected to the $\overline{Q}$ output of flip-flop FFm for setting flip-flop FFa when the monitor switches Sm1 and Sm2 are switched On, the output of NAND Nd being applied through a differentiator and an inverter 12 to flip-flop FFa.

A mono-stable multivibrator M generates a pulse at trailing edge of a predetermined scanning pulse corresponding to a specific channel, such as the sixteenth channel. Thus, when a scanning pulse is applied to NAND circuit N16, a pulse is generated by multivibrator M thereby stopping the scanning operation after a cycle of scanning all channels. The output of mono-stable multivibrator M is applied through an inverter 15 to a NAND circuit $N_f$. The above-mentioned specific channel is preferably selected to be the final channel of all channels from a viewpoint of design and visual presentation. Another input of NAND circuit $N_f$ is connected to the output Q of flip-flop FFm, and the output of NAND circuit $N_f$ is applied to an input of a NAND circuit $N_e$. The Q output of flip-flop FFm is further applied to an input of a NAND circuit $N_g$ and also to inputs R of flip-flops $FF_1 - FF_{16}$. The output of monitor switch Sm2 is applied through an inverter $I_4$ to another input of NAND circuit $N_e$, and the output thereof is applied through an inverter $I_3$ to input R of flip-flop FFa.

Before describing the monitor operation, the autoscanning operation of the circuit will first be described. The autoscanning switch Sa is switched ON, the monitor switches Sm1 and Sm2 being OFF. That is, the output of inverter $I_1$ is at the LOW level (hereinafter abbreviated to L). Flip-flop FFm is reset at this time. Hence, input 1 of NAND circuit $N_d$ is H and input 2 thereof is L, whereby the output 3 of NAND $N_d$ is at the HIGH level (hereinafter abbreviated to H), and the output is applied through the differentiator and inverter $I_2$ to flip-flop FFa. Since the S input of flip-flop FFa becomes L, the flip-flop is placed in its set state. As a result, the Q output of flip-flop FFa becomes H, and this output is connected to an input 7 of NAND Nc in switching circuit S. If no sensing signal is present at input A, input 11 of NAND Na is L and input 10 thereof connected to the $\overline{Q}$ output of flip-flop FFm is H whereby the output of NAND Na becomes H. The output 12 of NAND Na is connected to an input 5 of NAND Nb, and since the input 5 is H as described above, the clock pulses from pulse generating circuit P are gated through NAND Nb and appear at the output 6. The output 6 is connected to an input 8 of NAND Nc, and since input 7 thereof is H as described above, the clock pulses appear at output 9 of NAND Nc.

If a sensing signal occurs at input A, the output 12 of NAND Na becomes L, and no clock pulses are gated to output 6 of NAND Nb. Thus, when no sensing signal exists at input A, clock pulses are obtained at output 9 of NAND Nc. These clock pulses are counted by counter C and applied to decoder D. Scanning pulses from decoder D are sequentially applied to channel switching circuit CHS thereby scanning channels $CH_1$ through $CH_{16}$ sequentially.

If a sensing signal is eventually applied from a communication channel to input A, switching circuit S is turned OFF thereby blocking passage of further clock pulses. Hence, the channel scanning operation by channel switching circuit CHS is stopped at the oscillator circuits corresponding to the channel having the sensing signal. For instance, when a sensing signal is obtained from the second channel, the transmitter and receiver oscillator circuits $X_{2t}$ and $X_{2r}$ are kept ON, and transmission and reception are carried out in the second channel. Since the Q output of flip-flop FFm is L, the output 15 of NAND $N_g$ is H. Thus input 2b of NAND N2 is H. Since input 2a of NAND N2 is held at H by the application of a scanning pulse, the output 2c thereof is L, the flip-flop FF2 is switched to its set state. As a result, the Q output of flip-flop FF2 becomes H thereby turning a transistor T2 ON, and igniting a display element L2 which indicates that an input signal exists in the second channel. Thus, during autoscanning, output 15 of NAND Ng is always H and the first channel in which a sensing signal exists will cause the display element corresponding to that channel to ignite since scanning will stop and the element will stay ignited as long as communication occurs in the channel. At this time, all of the remaining flip-flops FF1, FF3, . . . , FF16 are kept in their reset states because the respective S inputs thereof are H.

After communication in channel 2 has been completed, the sensing signal is no longer present and autoscanning recommences. Thus, as the scanning pulse for the second channel terminates, input S of flip-flop FF2 becomes H and hence the Q output thereof becomes L thereby resetting flip-flop FF2. The reset of flip-flop FF2 extinguishes display element L2, and the scanning operation is continued until another channel having a sensing signal is detected.

The monitor circuit is operated by utilizing the above described autoscanning operation. However, with monitor operation, channels 1 through 16 are scanned only one time while the channels are repeatedly scanned in the autoscanning operation. Further, all channels having sensing signals are displayed rather than only the one over which communication is occurring. The operation of the monitor circuit will now be described in detail.

When the monitor switches Sm1 and Sm2 are depressed to the ON state, monitor switch Sm2 is connected +B, thereby turning the input R of flip-flop FFm to L through inverter $I_4$ to reset flip-flop FFm. Thus, the Q output of flip-flop FFm becomes L thereby causing input R of flip-flops FF1 – FF16 to become L, thus resetting all of the flip-flops FF1 – FF16. As a result, the Q outputs of flip-flops FF1 – FF16 become L, and the transistors T1 – T16 are turned OFF thereby extinguishing display elements L1 – L16, assuming they have been ignited from a previous monitor operation.

When monitor switches Sm1 and Sm2 are released, the switches are shifted back to the OFF state thereby causing the output of the inverter $I_1$ to become L, and thus placing flip-flop FFm in its set state with $\overline{Q}$ output thereof becoming L. The resistor parallel connected to monitor switch Sm2 provides level setting. When the $\overline{Q}$ output of FFm becomes L, the output 3 of NAND circuit Nd is H and is applied through inverter $I_2$ to the input S of flip-flop FFa thereby placing the flip-flop in its set state. The Q output of flip-flop FFa being H, switching circuit S is switched ON. Thus, the scanning pulses are generated as described in the autoscanning operation, and channels CH1 – CH16 are sequentially scanned, As a result, channels having sensing signals are displayed by the ignition of their corresponding display elements.

When the channel CH16 is scanned, the multivibrator M generates a pulse at the trailing edge of the scanning pulse, the output pulse of monostable multivibrator M being applied through inverter $I_5$ to input 17 of NAND circuit $Nf$ thereby placing input 17 in the H state. On the other hand, the Q output of flip-flop $FFm$, which is also H, is applied to the other input 16 of NAND circuit $Nf$ whereby the output 18 of $Nf$ is placed in the L state. The output of NAND $Nf$ is applied to input 20 of NAND $Ne$. Since the other input 19 of NAND $Ne$ is H, the output of NAND $Ne$ goes H and is applied through inverter $I_3$ to the R input of autoscanning flip-flop $FFa$ thereby resetting the flip-flop. Thus, the Q output of flip-flop $FFa$ becomes L, and switching circuit S is turned OFF to thereby stop the scanning operation. At this point in time, only those channels having sensing signals will have their corresponding flip-flops FF1 – FF16 placed in the set state thus operating the corresponding display circuits L1 – L16. For example, assuming a sensing signal is present in channel 2, the presence thereof at terminal 11 of NAND $Na$ will not stop the scanning operation since the $\overline{Q}$ output of $FFm$ is L thereby keeping the output 12 of NAND $Na$ at the H level. However, the sensing signal for channel 2 will be inverted by inverter $1_6$ so that input 14 of NAND $Ng$ becomes L. Prior to this inputs 13 and 14 where H and output 15 was L. Thus, when input 14 becomes L, output 15 becomes H and with the simultaneous occurrence of a scanning pulse on input $2a$ of NAND N2, display element L1 is ignited. After all channels have been scanned, those channels having sensing signals can be determined at a glance. Thus, when the second, eighth, and thirteenth channels have sensing signals, the displaying elements L2, L8, and L13 are ignited, and if it is desired to communicate in the second channel, for example, the oscillation circuits $X_{2t}$ and $X_{2r}$ can be switched ON by a manual operation (not shown). Note that the elements L2, L8, and L13 will be held in their ignited state since the Q output of $FFm$ is H and thus the flip-flops FF2, FF8 and FF13 are not reset as the scanning pulses leave N2, N8, and N13 respectively.

When changing to the autoscanning mode to the monitor mode, nonlock switch $Sb$ is depressed to reset $FFm$ and then switch $Sa$ is switched ON to effect autoscanning. Furthermore, when another monitoring operation is desired, the monitoring switches Sm1 and Sm2 are again ON-OFF operated, and this operation may be, of course, repeated as many times as desired to insure that the status of all channels has been monitored.

The scanning pulse for the sixteenth channel is also applied to monostable multivibrator M during autoscanning when all channels are scanned repeatedly. However, the input 16 of NAND circuit $N_f$ is L at this time, and thus flip-flop $FFa$ is not reset. It should also be noted that, although not shown, circuitry for generating sensing signal A may comprise any type of circuit for generating a pulse or the like, such as the squelch circuit mentioned hereinbefore. Further, circuitry corresponding to that used in the beforementioned copending application may be used. This may, for example, correspond to any circuitry which generates an output signal when the input signal thereto exceeds a given threshold. Such circuitry as referred to above is known and forms no part of this invention.

According to the present invention, the status of all channels can be determined at a glance so that the selection of a channel to be used can be easily effected and thus communication is thereby simplified. Although the invention has been described with respect to an example utilizing sixteen channels, the monitoring circuit of this invention can be operated more more effectively when the number of the channels increases to, for instance, 40 or 50.

Furthermore, the scanning speed, that is, the time required for one complete scanning of the channels, can be made a desired value by suitably selecting the number of clock pulses generated per unit time from the pulse generating circuit P. In the case of sixteen channels, as in the described example, the time required for one complete scanning may be conveniently selected to be one second or the like. Since the circuit may be made from combinations of low cost integrated circuits, the invention can easily be put into practice.

What is claimed is:

1. A station selecting device for use in a multi-channel communication system, said device comprising
 information signal receiving means for receiving information signals over at least one of a plurality of channels;
 means for generating a train of clock pulses of predetermined width and period;
 sensing signal generating means responsive to said information signals for generating a sensing signal for each of said channels whenever an information signal corresponding to one of said channels is present;
 scanning signal generating means responsive to said clock pulses for sequentially generating a plurlity of scanning signals respectively corresponding to the sensing signals of said plurality of channels of said information signal receiving means;
 a plurality of display means respectively corresponding to said channels; and
 control means responsive to said scanning signal generating means and said sensing signals for actuating those display means corresponding to the channels for which sensing signals are generated so that said last mentioned channels can be readily determined from the actuated display means, said control means including means for maintaining the generation of said scanning signals by said scanning signal generating means even though an information signal is sensed in one of said channels by said sensing means until a predetermined number of said scanning signals have been generated so that all channels having sensing signals can be displayed by said display means.

2. A device as in claim 1 where said control means includes
 a monitor flip-flop;
 means for manually controlling said monitor flip-flop and placing said device in a monitor mode of operation;
 first logic means responsive to said monitor flip-flop and said sensing signal; and
 a plurality of second logic means respectively corresponding to said plurality of display means, all said second logic means being responsive to said first logic means and said scanning signal generating means for actuating those display means corresponding to the channel for which sensing signals are generated.

3. A device as in claim 2 where said scanning signal generating means includes switching means for switching the scanning signal generating means ON and OFF and where said control means includes first pulse generating means for generating a pulse when a predetermined channel has been reached by said scanning signal generating means; and means responsive to said first pulse generating means and said monitor flip-flop for actuating said switching means to turn said scanning signal generating means off when said predetermined channel has been reached by said scanning signal generating means.

4. A device as in claim 3 where said control means includes an autoscanning flip-flop;

means for manually controlling said autoscanning flip-flop and placing said device in an autoscanning mode of operation;

means responsive to said autoscanning flip-flop for actuating said switching means to turn said scanning signal generating means ON when said device is placed in its autoscanning mode of operation;

third logic means responsive to said monitor flip-flop and sensing signal for switching said switching means OFF when a sensing signal is detected by said third logic means during said autoscanning mode so that the channel corresponding to said last-mentioned sensing signal can be communicated over.

5. A station selecting device for use in a multi-channel communication system, said device comprising information signal receiving means for receiving information signals over at least one of a plurality of channels;

means for generating a train of clock pulses of predetermined width and period;

sensing signal generating means responsive to said information signals for generating a sensing signal for each of said channels whenever an information signal corresponding to one of said channels is present;

scanning signal generating means responsive to said clock pulses for sequentially generating a plurlity of scanning signals respectively corresponding to the sensing signals of said plurality of channels of said information signal receiving means; plurality a plurality of display means respectively corresponding to said channels; and control means responsive to said scanning signal generating means and said sensing signals for actuating those display means corresponding to the channels for which sensing signals are generated so that said last mentioned channels can be readily determined from the actuated display means, said control means including a monitor flip-flop;

means for manually controlling said monitor flip-flop and placing said device in a monitor mode of operation;

first logic means responsive to said monitor flip-flop and said sensing signal; and a plurality of second logic means respectively corresponding to said plurality of display means, all said second logic means being responsive to said first logic means and said scanning signal generating means for actuating those display means corresponding to the channel for which sensing signals are generated, where said scanning signal generating means includes switching means for switching the scanning signal generating means ON and OFF and where said control means includes first pulse generating means for generating a pulse when a predetermined channel has been reached by said scanning signal generating means; and means responsive to said first pulse generating means and said monitor flip-flop for actuating said switching means to turn said scanning signal generating means off when said predetermined channel has been reached by said scanning signal generating means, and where said control means further includes an autoscanning flip-flop;

means for manually controlling said autoscanning flip-flop and placing said device in an autoscanning mode of operation;

means responsive to said autoscanning flip-flop for actuating said switching means to turn said scanning signal generating means ON when said device is placed in its autoscanning mode of operation;

third logic means responsive to said monitor flip-flop and sensing signal for switching said switching means OFF when a sensing signal is detected by said third logic means during said autoscanning mode so that the channel corresponding to said last-mentioned sensing signal can be communicated over; and means for so controlling said monitor flip-flop during said monitor operation that said third logic means does not turn said switching means OFF each time a sensing signal is generated so that all channels having sensing signals can be displayed by said display means after said predetermined channel has been reached by said scanning signal generating means.

* * * * *